United States Patent

Itoh et al.

[15] 3,642,526

[45] Feb. 15, 1972

[54] SEMICONDUCTOR SURFACE BARRIER DIODE OF SCHOTTKY TYPE AND METHOD OF MAKING SAME

[72] Inventors: Yokichi Itoh; Norikazu Hashimoto, both of Hachioji-shi, Japan

[73] Assignee: Hitachi, Ltd., Tokyo, Japan

[22] Filed: Mar. 6, 1969

[21] Appl. No.: 804,757

[52] U.S. Cl. ..............................117/200, 117/213, 117/227, 117/107.2 R, 317/234 R

[51] Int. Cl. ..........................................H01l 7/44, H01l 7/50

[58] Field of Search ...............117/227, 200, 107.2; 317/234, 317/235; 29/571

[56] References Cited

UNITED STATES PATENTS

| | | | |
|---|---|---|---|
| 3,349,297 | 10/1967 | Crowell et al. | 317/235 |
| 3,519,479 | 7/1970 | Inoue et al. | 117/200 |

*Primary Examiner*—Ralph S. Kendall
*Attorney*—Craig, Antonelli & Hill

[57] ABSTRACT

A semiconductor surface barrier diode of Schottky type comprising a contact of semiconductor and metal or a compound of the metal and the semiconductor, wherein the contact surface forming a barrier is formed remarkably uneven so as to adjust the barrier height.

25 Claims, 14 Drawing Figures

FIG. 1
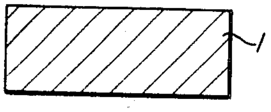
FIG. 2
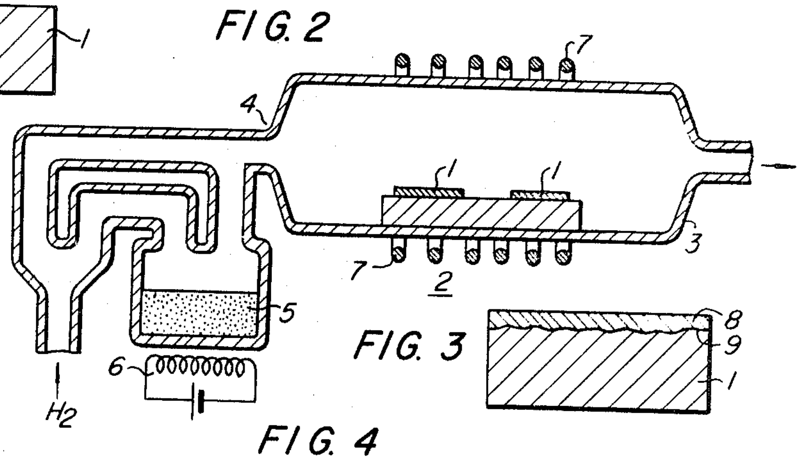
FIG. 3
FIG. 4
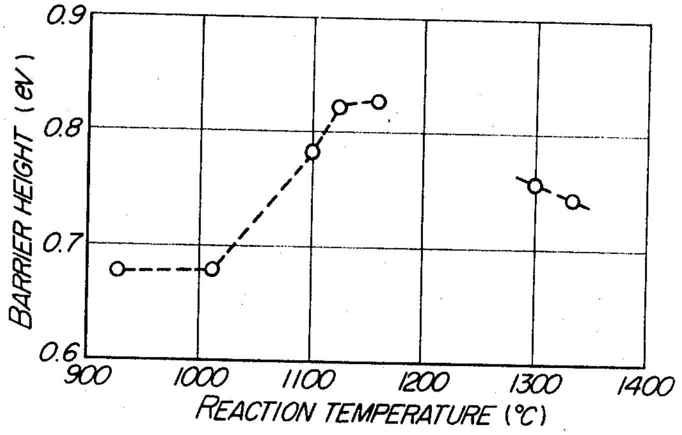
FIG. 5
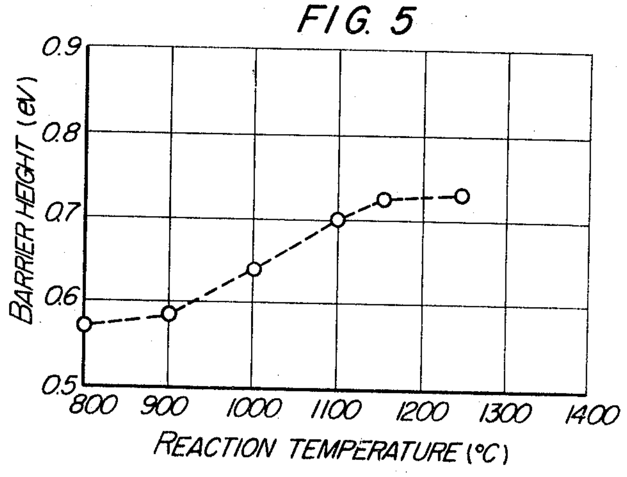
INVENTORS
YOKICHI ITOH AND NORIKAZU HASHIMOTO
BY Craig, Antonelli, Stewart & Hill
ATTORNEYS

INVENTORS

YOKICHI ITOH AND NORIKAZU HASHIMOTO

BY Craig, Antonelli, Stewart & Hill

ATTORNEYS

SEMICONDUCTOR SURFACE BARRIER DIODE OF SCHOTTKY TYPE AND METHOD OF MAKING SAME

BACKGROUND OF THE INVENTION

1. Field of the Invention

This invention relates to a semiconductor device having a Schottky-type surface barrier and to the method of making the same, and more particularly to a semiconductor device having a Schottky-type surface barrier, the height of which has been controlled and the method of making the same.

2. Description of the Prior Art

When a semiconductor substrate is brought into close contact with a metal having a work function $\Phi_m$ higher than the work function $\Phi_s$ of the semiconductor or with a compound of such metal and of the semiconductor, electrons diffuse from the semiconductor into the metal or compound to establish a diffusion potential $V_d$ at the contact portion. This diffusion potential forms a barrier against charge carriers flowing through the contact portion. Such a barrier is a kind of surface barrier and generally called Schottky barrier. In this specification, we call it surface barrier of Schottky type and its height the barrier height.

Recently, metal-to-semiconductor contacts and compound-to-semiconductor contacts forming such surface barriers are frequently employed in microwave mixer diodes, high-speed switching diodes, voltage clamping diodes and semiconductor integrated circuits embodying these elements, utilizing the diffusion potential $V_d$ of the contact.

Conventionally, the height of a surface barrier of Schottky type was determined uniquely by the combination of metal and semiconductor used and it was hard to change its value to a great extent. Although it has been conventionally known that variations of the order of ±0.02 e.v. are available by a surface treatment of a semiconductor substrate by etching or the like, these variations are too small to be of interest. Therefore, when a Schottky-type diode having a predetermined diffusion potential $V_d$ was desired, there was no other way but to select an adequate metal-to-semiconductor contact having a diffusion potential in the vicinity of the desired value. There is no problem in case there is a combination having a desired value, but when there is a large difference between the desired value and the value practically available, there arise difficult problems. Especially nowadays there is a strong demand for surface barrier diodes of Schottky type having an extremely high or an extremely low diffusion potential. However, among the conventionally known surface barriers of Schottky type, the highest barrier is formed by platinum to silicon contact and its height is about 0.9 e.v., and the lowest is about 0.6 e.v. formed by molybdenum or nickel, etc., and *n*-type silicon. Thus, conventionally available barriers do not satisfy the present requirements.

SUMMARY OF THE INVENTION

One object of the invention is to provide a semiconductor diode having a surface barrier of Schottky type the height of which can be adjusted.

Another object of the invention is to provide a method for varying remarkably widely the height of a surface barrier of Schottky type, or in other words a method for making a semiconductor device having a surface barrier of Schottky type of arbitrarily selected barrier height.

According to the feature of the invention, a semiconductor surface barrier diode of Schottky type has a remarkably uneven contact surface between a semiconductor and a metal or the compound of the semiconductor and the metal. By this contact structure, the height of a Schottky type surface barrier can be varied from the value conventionally determined uniquely by the materials to be used.

The degree of unevenness of the contact surface, i.e., the height of projections or depth of dents or grooves, is substantially in the range of about 100 angstroms to several microns. It is not intended to exclude values outside of this range, but beyond this range variations in the barrier height with respect to the degree of unevenness of the contact surface become small.

According to the invention, the height of a surface barrier of Schottky type can be varied even more than ±0.1 e.v.

Semiconductor surface barrier diodes of the above kind can be formed by the following methods.

A first method to form an uneven contact surface is by a chemical process wherein a metal capable of forming a Schottky barrier is deposited on a semiconductor substrate by thermal decomposition or hydrogen reduction of a halide of the metal. The metal and the semiconductor may form a compound during deposition or by heat treatment following the deposition. Uneveness of the contact surface is obtained by increasing the reaction temperature for forming the compound above a certain definite temperature, referred to as the "characteristic temperature," inherent to the combination of metal and semiconductor to be used.

Particularly in the hydrogen reduction of a halide, the reaction can be performed at an arbitrary temperature above the characteristic temperature so that a compound of the deposited metal and the semiconductor can be formed at the same time with the deposition process and an uneven contact surface of Schottky type can be provided. However, in the case of thermal decomposition, the temperature of the decomposition is low relative to the characteristic temperature so that a contact surface obtained from the thermal decomposition is not uneven but smoothly flat. Therefore, the thermal decomposition method needs a separate heat treatment above the characteristic temperature.

According to another method, the surface of a semiconductor substrate is made uneven by a mechanical expedient. The degree of uneveness, i.e., dimensions of projections and dents, is selected to be of the order of several microns. Then, metal capable of forming a surface barrier of Schottky type is deposited on the uneven surface thus formed.

As method for making a surface uneven by a mechanical expedient, grinding the surface with powder of hard material such as $Al_2O_3$ or SiC or spraying similar material by a sandblaster or the like is one of the easiest to be employed. Especially in the case of forming a surface barrier diode of Schottky type in a minute area as in IC or LSI, the desired minute area of the semiconductor may be bombarded by ions of a relatively heavy element such as argon to make the surface uneven.

BRIEF DESCRIPTION OF THE DRAWINGS

FIGS. 1 to 4 illustrate one embodiment of the invention in which:

FIG. 1 is a schematic cross section of a semiconductor substrate;

FIG. 2 is a schematic cross section of a reaction furnace containing the semiconductor substrates shown in FIG. 1;

FIG. 3 is a schematic cross section of the semiconductor element shown in FIG. 1 in another step; and

FIG. 4 shows the relation between the reaction temperature and the barrier height;

FIG. 5 shows the relation between the reaction temperature and the barrier height according to another embodiment of the invention;

FIGS. 6 to 9 illustrate another embodiment of the invention in which:

FIG. 6 is a schematic cross section of a semiconductor substrate;

FIG. 7 is a schematic cross section of a reaction furnace; and

FIGS. 8 and 9 show schematic cross sections of the semiconductor element shown in FIG. 6 but in other steps;

FIGS. 10 to 13 illustrate another embodiment of the invention in which:

FIGS. 10 to 12 are schematic cross sections of a semiconductor substrate in various steps; and

FIG. 13 shows the relation between the degree of uneveness and the barrier height;

FIG. 14 shows the relation between the reaction time and the barrier height according to another embodiment of the invention.

DESCRIPTION OF THE PREFERRED EMBODIMENTS

EXAMPLE 1

Figures 6, 7, 8, 9, 10, 11, 12, 14:
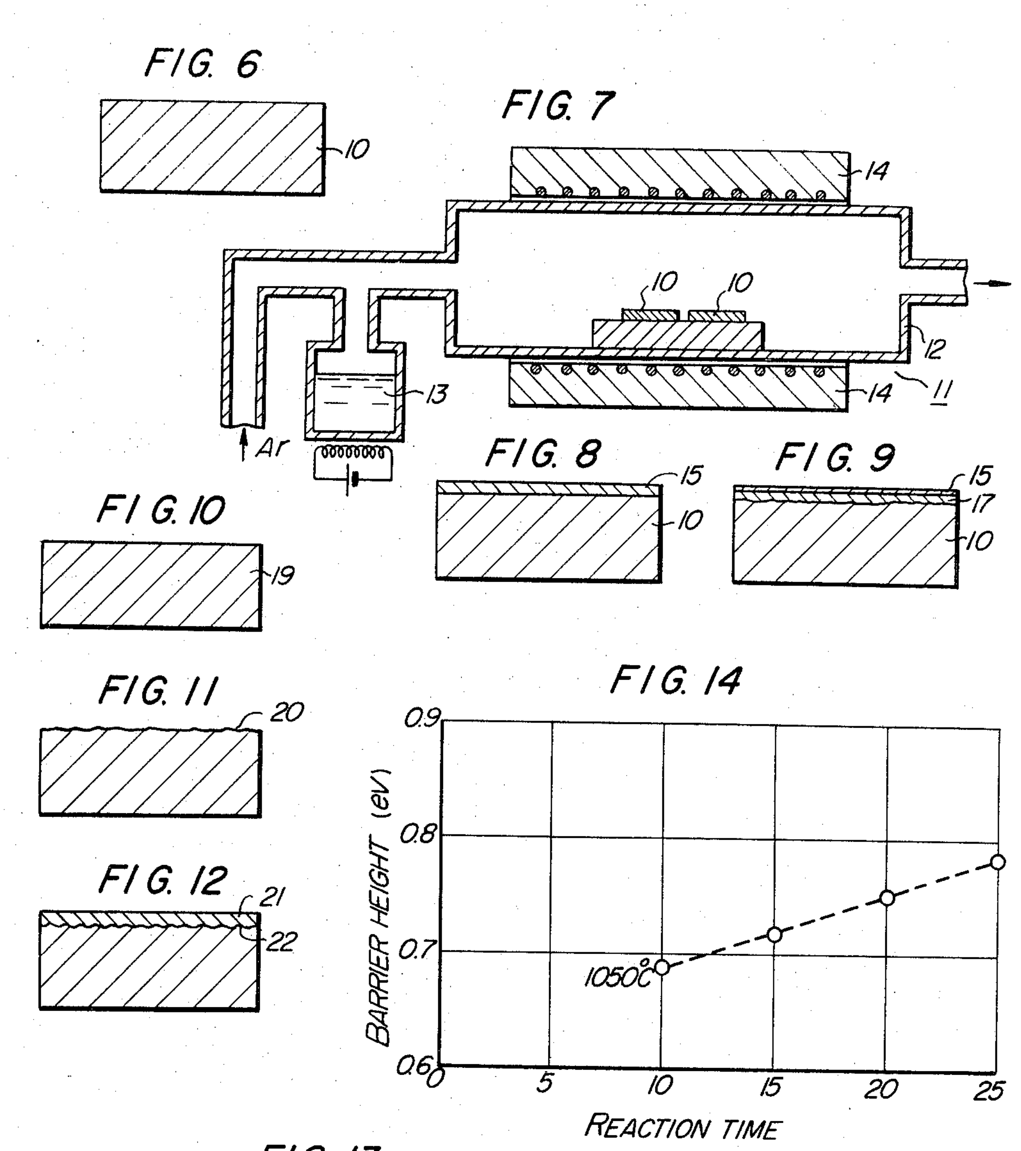

FIG. 1 shows a silicon substrate 1, the surface of which is cleaned by etching. The substrate 1 is then placed in a reaction furnace 2 as shown in FIG. 2 in which hydrogen $H_2$ gas and tungsten hexachloride $WCl_6$ vapor are introduced through an inlet 4 into a quartz reaction tube 3. The tungsten hexachloride vapor is generated by heating tungsten hexachloride powder 5 to a temperature of about 360° C. by a heater 6. The substrate 1 in the reaction tube can be heated to an arbitrary temperature by an induction coil 7 disposed around the reaction tube 3.

When the substrate is heated to an arbitrary temperature not lower than 800° C., tungsten chloride introduced into the reaction tube is subjected to reduction by hydrogen present in the tube to deposit tungsten on the substrate. The deposited tungsten and the silicon substrate react with each other and form a tungsten silicide $WSi_2$ layer 8 at the surface portion of the substrate by diffusion between tungsten and silicon. FIG. 3 shows a silicon to tungsten silicide contact in cross section in which numeral 9 indicates a contact portion between the tungsten silicide layer 8 and the silicon substrate 1. At reaction temperatures below 1,100° C., a tungsten layer is formed on the surface of the tungsten silicide layer 8.

FIG. 4 shows the relation between the barrier height of the $WSi_2$-Si contact and the temperature at which the contact is formed. The time duration for the formation of the contact is 10 minutes for every case.

As is evident from the figure, in the case of $WSi_2$-Si contact, the barrier height rapidly increases when the reaction temperature exceeds 1,000° C. This is a novel finding and considered to result from the formation of an uneven contact surface. In the case of $WSi_2$-Si contact, it was found that the barrier height varies up to about 0.15 e.v. with the reaction temperature. From about 1,250° C., the barrier height begins to decrease with the reaction temperature as is evident from FIG. 4. The reason for this phenomenon is considered to be that the barrier at the contact is locally destroyed to form nonrectifying contact. This reasoning is also supported by the fact that when the temperature of heat treatment is raised above a certain point, no surface barrier of Schottky type is formed but rather an ohmic contact.

The present inventors have studied the phenomenon that in Si-W series contact the barrier height of a surface barrier of Schottky type rapidly increases with the reaction temperature above about 1,000° C., in the following manner.

Silicon substrates having a $WSi_2$-Si surface barrier of Schottky type obtained through heat treatment at various temperatures were made relatively thin to a thickness below about 1,000 A., which an electron beam can penetrate sufficiently, by etching the substrate portion to leave the contact portion and then were subjected to analysis of transmitted electron ray diffraction. It was found that in the barriers made above 800° C. $WSi_2$ is present in the nearest portion from the silicon substrate. Further, the contact surface was flat when the reaction temperature was below 1,000° C., but when the reaction temperature was above 1,000° C., the contact surface formed interfused regions and the degree of unevenness is increased.

Consequently, it can be concluded that the height of a surface barrier of Schottky type is dependent on the degree of flatness, or the degree of unevenness, of the junction surface.

FIG. 5 shows another relation between the barrier height and the reaction temperature. Here, surface barriers are formed of a molybdenum silicide layer and a silicon substrate. Molybdenum is generated by the hydrogen reduction of molybdenum chloride. It can be seen from Fig. 5 that a reaction temperature above 900° C. is necessary to make an Si-$MoSi_2$ contact uneven and thereby to vary the height of a surface barrier.

EXAMPLE 2

FIG. 6 shows a silicon substrate 10, the surface of which is cleaned by etching. Then, the silicon substrate 10 is placed in a reaction tube 12 of a reaction furnace 11, both being made of nickel. Into the reaction tube 12, predetermined amounts of Ar gas and $WF_6$ vapor are introduced. The $WF_6$ gas is generated from $WF_6$ solution 13 and introduced into the tube and then subjected thermal decomposition in the vicinity of the substrate 10 which is heated to a temperature of about 400° C. by a resistance furnace 14. Decomposed tungsten deposits on the silicon substrate surface to form a tungsten layer 15 as is illustrated in FIG. 8. In this state, the contact surface of the interface between the layer 15 and the substrate 10 is still flat and the height of the surface barrier of Schottky type appearing thereat is equal to the conventionally known value.

After the deposition of tungsten, the substrate 10 is heated in the furnace 11 above the characteristic temperature of Si-W series contact, i.e., 1,000° C., in an argon atmosphere. Then, a reaction between tungsten and silicon occurs at the interface to form a tungsten silicide $WSi_2$ layer 17 and to make an uneven contact surface between the layer 17 and the substrate 10 as is illustrated in FIG. 9. When the reaction time or period is made sufficiently long, all the deposited tungsten will be converted to tungsten silicide.

When molybdenum is used in place of tungsten in this example, a halide of molybdenum, e.g., $MoCl_5$, is used in place of $WCl_6$. The thermal decomposition temperature for $MoCl_5$ is 400° C. and the characteristic temperature to make the contact surface uneven is 900° C. It will be apparent that the thermal decomposition process is not essential but metal may directly be deposited on a semiconductor surface by vacuum evaporation method and then subjected to heat treatment at a temperature above the characteristic temperature to form a compound with the semiconductor and an uneven contact surface.

EXAMPLE 3

FIG. 10 shows a silicon substrate 19 having a flat etched surface. Only the selected portion of the substrate surface where a surface barrier of Schottky type is to be formed is ground with powder particles made of hard alumina or SiC to form an uneven surface 20 and then ultrasonically washed. Then the semiconductor substrate 19 is subjected to etching treatment with ultrasonic waves for three minutes in a mixed solution of $HNO_3$ and HF mixed at a ratio of 50:3 to remove 5 $\mu$ of stressed layer due to grinding. Then, nickel is deposited by vacuum evaporation on the ground surface to form a nickel layer 21 as shown in FIG. 12. The contact surface 22 of silicon and deposited nickel forms a surface barrier of Schottky type.

Figure 13:
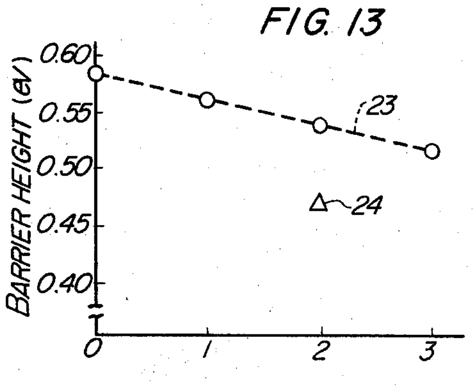

FIG. 13 shows the relation between the unevenness or roughness of the silicon surface and the barrier height formed thereat. A broken line 23 represents the case in which the silicon substrate surface is ground with hard alumina powder. A point 24 represents the barrier height when grooves having a depth of 2 $\mu$ are formed in a silicon surface which has been etched beforehand with an interval of 2 $\mu$ using photoresist technique and then nickel is deposited on the grooved surface.

As has been described hereinbefore on specific embodiments of this invention, it has become possible to vary to a large extent the height of a surface barrier of Schottky type which has conventionally been uniquely determined by materials forming the contact.

For example, employing a $WSi_2$-$n$ type Si barrier, a surface barrier of Schottky type having an arbitrary height in the range of about 0.68 to about 0.85 e.v. can be obtained by the arrangement of the interface.

Conventionally, plane to plane contacts of metal and n type silicon are known to have the following barrier heights.

| | | | |
|---|---|---|---|
| Ti | n type Si | : | ~ 0.55 ev. |
| Cr | n type Si | : | ~ 0.60 ev. |
| W | n type Si | : | ~ 0.65 ev. |
| Ag | n type Si | : | ~ 0.70 ev. |
| Au | n type Si | : | ~ 0.80 ev. |

| | | |
|---|---|---|
| Pt n type Si | : | 0.90 ev. |

The barrier height of each combination can be varied up to about ±0.1 e.v. so that diodes of Schottky type having various barrier heights can be made.

Further, a similar effect can be obtained by varying the reaction time instead of varying the reaction temperature. FIG. 14 shows the relation between the barrier height and the reaction time on the period of reaction in the case of $WSi_2$-*n* type Si barrier wherein the reaction temperature is kept at 1,050° C. and the reaction time is varied in the range of 10 to 25 minutes. The barrier height varied from 0.68 to 0.79 e.v. as is seen in FIG. 14. A similar phenomenon is seen in the case of molybdenum silicide and n type silicon the contact of which is formed at a temperature above 1,000° C. by the hydrogen reduction of $MoCl_5$.

Although the description has been made with embodiments using silicon substrates, other semiconductors such as Ge, GeAs, InP, InSb, GaP or the like are similarly effective.

While specific embodiments of the invention have been illustrated and described, it will be apparent that other alternations and modifications are possible without departing from the spirit and scope of the invention.

We claim:

1. A semiconductor surface barrier diode of Schottky type comprising
   - a semiconductor substrate, and
   - a layer contacting the semiconductor substrate and made of a material capable of forming a surface barrier in the semiconductor substrate with the formation of an intermediate compound between said material and said substrate,
   - the contact surface between said substrate and the intermediate compound being sufficiently uneven by the presence of interfused regions to provide a predetermined barrier height different from the normal value thereof determined by said material and semiconductor exclusively.

2. The semiconductor surface barrier diode of Schottky type according to claim 1, wherein the degree of unevenness is larger than 100 A. but smaller than a few microns.

3. The semiconductor surface barrier diode of Schottky type according to claim 1, wherein said semiconductor is selected from the group consisting of Si, Ge, GaAs, InP and GaP.

4. The semiconductor surface barrier diode of Schottky type according to claim 1, wherein said material is selected from the group of Ti, Cr, W, Mo, Ag, Au, Pt and silicides thereof and said semiconductor is silicon.

5. A method of controlling the barrier height in the manufacture of a semiconductor surface barrier diode of Schottky type comprising the steps of
   - preparing a semiconductor substrate having at least one flat plane surface,
   - depositing a metal capable of inducing a surface barrier in the semiconductor substrate on the plane surface of the semiconductor substrate, and
   - heating the assembly at a predetermined temperature above the characteristic temperature so that the deposited metal reacts with the semiconductor to form a compound and that the compound forms an uneven contact surface with the semiconductor substrate.

6. A method according to claim 5, wherein said deposition step is effected by heating the semiconductor substrate in an atmosphere including a halide of said metal at a temperature at which said metal halide is thermally decomposed.

7. A method according to claim 6, wherein said semiconductor is silicon.

8. A method according to claim 6 further comprising the step of again heating the assembly at the same temperature as that of the preceding heating step for a selected period to readjust the barrier height at the contact portion.

9. A method of making a semiconductor surface barrier diode of Schottky type according to claim 7, wherein said metal halide is one selected from the group consisting of $WF_6$ and $MoF_6$.

10. A method of making a semiconductor surface barrier diode of Schottky type according to claim 7, wherein the temperature of the thermal decomposition is about 400° C.

11. A method of making a semiconductor surface barrier diode of Schottky type according to claim 7, wherein said metal halide is $WF_6$ and the temperature of the heating step for causing reaction is above 1,000° C. but below 1,250° C.

12. A method of making a semiconductor surface barrier diode of Schottky type according to claim 7, wherein said metal halide is $MoF_6$ and the temperature of heating for causing reaction is above 900° C. but below the melting point of silicon.

13. A method of making a semiconductor surface barrier diode of Schottky type comprising the steps of:
   - preparing a semiconductor substrate having a flat surface; and
   - heating the semiconductor substrate in an atmosphere comprising a gas mixture of hydrogen and a halide of a metal capable of forming a surface barrier with the semiconductor substrate to a temperature at which the halide of the metal is reduced by hydrogen to deposit on the substrate, the deposited metal forming a compound with the semiconductor and the contact surface of the compound and the substrate being uneven.

14. A method according to claim 13 further comprising the step of heating the assembly at the same temperature as that of the preceding heating step for a selected period to readjust the barrier height at the contact portion.

15. A method of making a semiconductor surface barrier diode of Schottky type according to claim 13, wherein said semiconductor is silicon.

16. A method of making a semiconductor surface barrier diode of Schottky type according to claim 13, wherein said halide of a metal is one selected from the group consisting of $WCl_6$ and $MoCl_5$.

17. A method of making a semiconductor surface barrier diode of Schottky type according to claim 13, wherein said metal halide is $WCl_6$ and said temperature is above 1,000° C. but below 1,250° C.

18. A method of making a semiconductor surface barrier diode of Schottky type according to claim 13, wherein said metal halide is $MoCl_5$ and said temperature is above 900° C. but below the melting point of the semiconductor.

19. A method of making a semiconductor surface barrier diode of Schottky type comprising the steps of
   - preparing a semiconductor substrate having at least one flat surface;
   - making part of said flat surface uneven by a mechanical process; and
   - depositing a metal capable of forming a surface barrier with the semiconductor substrate on the uneven surface, thereby obtaining an uneven interface of the semiconductor substrate and the metal.

20. A method of making a semiconductor surface barrier diode of Schottky type according to claim 19, wherein said semiconductor substrate is silicon.

21. A method of making a semiconductor surface barrier diode of Schottky type according to claim 19, wherein said semiconductor is silicon and said metal is selected from the group consisting of W, Mo, Au, Ag, Cr, Pt and Ti.

22. A method of making a semiconductor surface barrier diode of Schottky type according to claim 19, wherein said mechanical process for forming the uneven surface part is grinding with powder particles of hard material selected from the group consisting of $Al_2O_3$ and SiC.

23. A semiconductor surface barrier diode of Schottky type comprising:
   - a semiconductor substrate; and
   - a layer contacting said semiconductor substrate, said layer being made of a material capable of forming a surface barrier with said semiconductor, the contact plane between said semiconductor substrate and said layer being of an uneven plane, the degree of uneveness of said plane being not less than about 100 angstroms but not larger than about 3 microns.

24. A method of making a semiconductor surface barrier diode of Schottky type comprising the steps of:

preparing a silicon substrate having a flat surface;

depositing a metal on said surface of said substrate by heating said silicon substrate in an atmosphere including a halide of said metal capable of forming a surface barrier with said semiconductor to a temperature at which said metal halide thermally decomposes; and heating the structure to a temperature at which the deposited metal reacts with said semiconductor substrate to form a compound of said metal and said semiconductor, with said compound producing an uneven interface with said semiconductor substrate.

25. A method of controlling the barrier height in the manufacture of a semiconductor surface barrier diode of Schottky type comprising the steps of:

preparing a semiconductor substrate having at least one exposed surface, and depositing a metal, capable of forming a surface barrier with said semiconductor, on the surface of said substrate in such a manner that the height of the barrier is determined by the degree of unevenness of the interface between said semiconductor substrate and a compound produced by the reaction of said metal and said semiconductor substrate in the presence of heat, including heating for such length of time and at such temperature that the desired degree of unevenness is produced corresponding to a predetermined barrier height.

* * * * *

UNITED STATES PATENT OFFICE

CERTIFICATE OF CORRECTION

Patent No. 3,642,526 Dated February 15, 1972

Inventor(s) Yokichi Itoh and Norikazu Hashimoto

It is certified that error appears in the above-identified patent and that said Letters Patent are hereby corrected as shown below:

Title Page, left column

The following should be inserted:

"Foreign Application Priority Data

Japan March 8, 1968 14664/68"

Signed and sealed this 11th day of July 1972.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
U.S. GOVERNMENT PRINTING OFFICE : 1969 O—366-334